United States Patent [19]
Park et al.

[11] Patent Number: 5,793,226
[45] Date of Patent: Aug. 11, 1998

[54] DATA OUTPUT BUFFER FOR MULTIPLE POWER SUPPLIES

[75] Inventors: Hee-Choul Park; Kook-Hwan Kwon, both of Kyungki-do, Rep. of Korea

[73] Assignee: Samsung Electronics, Co., Ltd. Suwon, Rep. of Korea

[21] Appl. No.: 697,088

[22] Filed: Aug. 19, 1996

[30] Foreign Application Priority Data

Aug. 18, 1995 [KR] Rep. of Korea ............... 1995 25475

[51] Int. Cl.[6] .................. H03K 19/0185; H03K 19/094
[52] U.S. Cl. ...................... 326/86; 326/17; 326/27
[58] Field of Search ................... 326/26–27, 80–81, 326/83, 86, 121, 33, 57–58; 327/227

[56] References Cited

U.S. PATENT DOCUMENTS

| 5,124,579 | 6/1992 | Naghshineh | 326/33 |
| 5,369,316 | 11/1994 | Chen et al. | 326/83 |
| 5,391,940 | 2/1995 | Linn | 326/83 |
| 5,430,391 | 7/1995 | Fujimoto et al. | 326/58 |
| 5,559,452 | 9/1996 | Saito | 326/83 |
| 5,604,453 | 2/1997 | Pedersen | 326/83 |

FOREIGN PATENT DOCUMENTS

| 2-96428 | 4/1990 | Japan | 326/27 |

*Primary Examiner*—Jon Santamauro
*Attorney, Agent, or Firm*—Marger, Johnson, McCollom, & Stolowitz P.C.

[57] ABSTRACT

A data output buffer circuit for a semiconductor memory device operates with two separate power supplies and prevents malfunctions caused by the sequence in which the power supplies are energized. At lease one discharge transistor is used to remove charge from the gate of one or more NMOS push-pull transistors in an output buffer which can be floating in a charged state if one of the power supplies is energized before the other. In one embodiment, the gates of two discharge transistors are cross-coupled to the gates of the push-pull transistors to assure that at least one of the push-pull transistors are turned off. In an alternative embodiment, one or more discharge transistors are connected to the gates of at least one push-pull transistor and are controlled by a pulse generator that generates a pulse signal in response to variations in the voltage of the power supply for the push-pull transistors. In another alternative embodiment, the push-pull buffer includes a PMOS push transistor and an NMOS pull transistor. An inverter, which is powered by the same power supply as the push-pull buffer, drives the gate of the PMOS transistor. Two discharge transistors are connected to the gates of the push-pull transistors, and the gates of the two discharge transistors are cross-coupled to the gate of the NMOS pull transistor and the input of the inverter to assure that at least one of the push-pull transistors are turned off.

18 Claims, 4 Drawing Sheets

DATA OUTPUT BUFFER FOR MULTIPLE POWER SUPPLIES

This application corresponds to Korean Patent Application No. 25475/1995 filed Aug. 18, 1995 in the name of Samsung Electronics Co., Ltd., which is herein incorporated by reference.

BACKGROUND OF THE INVENTION

1. Field of the Invention

This invention relates generally to data output buffers for use in semiconductor memory devices and more particularly to data output buffers that operate with multiple power supplies.

2. Description of the Related Art

As the operational speeds of semiconductor chips have increased, different interfaces have been used between devices in order to reduce the voltage swing and accommodate the increased operational speeds. Transistor-transistor logic (TTL) has given way to LSTTL, HSTTL, GTL and the like. However, some semiconductor memory devices still require higher power supply voltages to run the interior functions of the chip. Thus, the power supply voltage provided to a chip may be divided into a first power supply voltage, e.g. 3.3 volts, for running the interior of the chip, and a second power supply voltage, e.g. 2.5 volts or 1.2 volts, for running the interface circuitry such as data output buffers. However, using two different power supplies for different circuitry on the same chip can cause power sequencing problems which, in turn, can cause malfunction or destruction of the chip as will be explained below.

FIG. 1 is a schematic diagram of a prior art data output buffer circuit used in a conventional semiconductor memory device which employs two power supply voltages. The circuit of FIG. 1 includes a logic circuit having a data latch 10, and first and second NOR gates 11 and 12, all of which are powered by a first power supply voltage VDD. A push-pull output driver stage includes NMOS transistors 13 and 14 which are powered by a second power supply voltage VDQ. The NOR gate 11 has a first input terminal which receives a first data signal DOUP from the interior of the chip, and a second input which receives an output enable signal /OE. NOR gate 12 has a first input terminal which receives a complimentary data signal DODP from the interior of the chip and a second input terminal which receives the output enable signal /OE. The data latch 10 includes a pair of cross coupled inverters which are connected between the first input terminal of NOR gate 11 and the first input terminal of NOR gate 12. The push-pull output stage includes a first NMOS transistor having its channel connected between the second power supply VDQ and a node N1 for outputting the data output signal DOUT. The push-pull output stage also includes a pull-down NMOS transistor 14, which has its channel connected between node N1 and a ground terminal. The gate of transistor 13 is connected to the output of NOR gate 11, while the gate of transistor 14 is connected to the output terminal of NOR gate 12.

In operation, the circuit of FIG. 1 will operate properly if the first power supply VDD is energized before the second power supply VDQ. Likewise, if the first power supply VDD is de-energized before the second power supply VDQ, the circuit will also operate properly. However, in the event that the second power supply VDQ is energized before the first power supply VDD, the gates of NMOS transistors 13 and 14 will be left in a floating state, which may result in transistors 13 and 14 simultaneously turning on. If both transistors turn on at the same time, the second power supply VDQ will be short circuited, which may cause the chip to malfunction.

Accordingly, the need remains for a data output buffer circuit which overcomes the above-mentioned problems.

SUMMARY OF THE INVENTION

It is, therefore, an object of the invention to provide a data output buffer circuit that operates properly from multiple power supplies regardless of the sequence in which the power supplies are energized.

A data output buffer circuit in accordance with the present invention uses at lease one discharge transistor to remove charge from the gate of one or more push pull transistors in an output buffer which can be floating in a charged state if one of the power supplies is energized before the other.

One aspect of the present invention is a data output buffer circuit comprising: a logic circuit having a first output terminal and a second output terminal, the logic circuit powered by a first power supply; a pull-up transistor having a controlled current path coupled between a second power supply and a data output terminal and a control terminal coupled to the first output terminal of the logic circuit; a pull-down transistor having a controlled current path coupled between a ground terminal and the data output terminal and a control terminal coupled to the second output terminal of the logic circuit; a first discharge transistor having a controlled current path coupled between the control terminal of the pull-up transistor and the ground terminal and a control terminal coupled to the control terminal of the pull-down transistor; and a second discharge transistor having a controlled current path coupled between the control terminal of the pull-down transistor and the ground terminal and a control terminal coupled to the control terminal of the pull-up transistor.

The logic circuit includes: a first inverter having an output terminal that forms the first output terminal of the logic circuit, an input terminal for receiving a data signal, and a power supply terminal coupled to the first power supply; a second inverter having an output terminal that forms the second output terminal of the logic circuit, an input terminal for receiving a complimentary data signal, and a power supply terminal coupled to the first power supply; and a data latch circuit coupled between the input terminals of the first and second inverters.

Another aspect of the present invention is a data output buffer circuit comprising: a logic circuit having a first output terminal and a second output terminal, the logic circuit powered by a first power supply; a pull-up transistor having a controlled current path coupled between a second power supply and a data output terminal and a control terminal coupled to the first output terminal of the logic circuit; a pull-down transistor having a controlled current path coupled between a ground terminal and the data output terminal and a control terminal coupled to the second output terminal of the logic circuit; a pulse generator that generates a pulse signal responsive to variations in the voltage level of the second power supply; and a first discharge transistor having a controlled current path coupled between the control terminal of the pull-up transistor and the ground terminal and a control terminal coupled to the pulse generator to receive the pulse signal.

A second discharge transistor having a controlled current path can be coupled between the control terminal of the pull-down transistor and the ground terminal and a control terminal can coupled to the pulse generator to receive the pulse signal.

A further aspect of the present invention is a data output buffer circuit comprising: a logic circuit having a first output terminal and a second output terminal, the logic circuit powered by a first power supply; an inverter having an input terminal coupled to the first output terminal of the logic circuit, a power supply terminal coupled to the first power supply, and an output terminal; a pull-up transistor having a controlled current path coupled between a second power supply and a data output terminal and a control terminal coupled to the output terminal of the inverter; a pull-down transistor having a controlled current path coupled between a ground terminal and the data output terminal and a control terminal coupled to the second output terminal of the logic circuit; a first discharge transistor having a controlled current path coupled between the control terminal of the pull-up transistor and the ground terminal and a control terminal coupled to the control terminal of the pull-down transistor; and a second discharge transistor having a controlled current path coupled between the control terminal of the pull-down transistor and the ground terminal and a control terminal coupled to the first output terminal of the logic circuit.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 1:
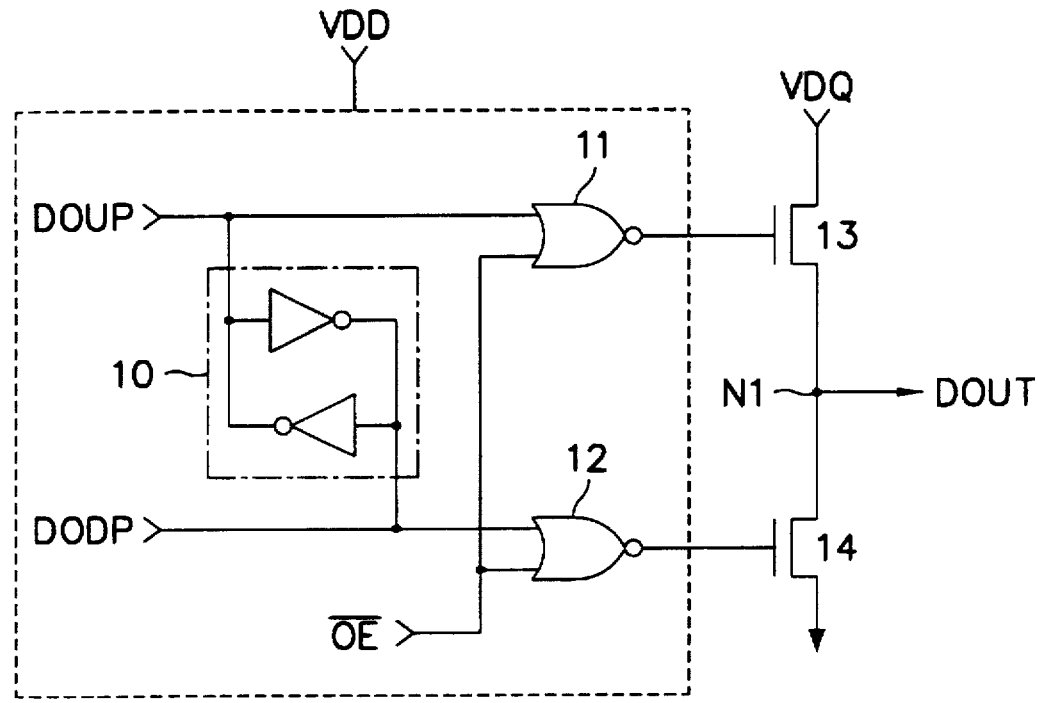
FIG. 1 is a schematic diagram of a prior art data output buffer circuit for use with multiple power supplies.
Figure 2:
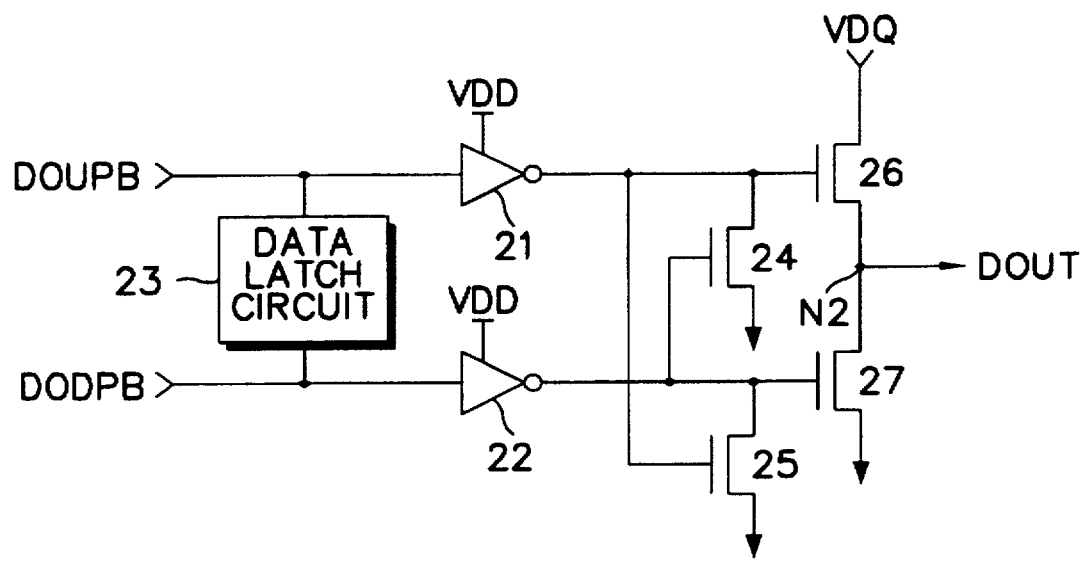
FIG. 2 is a schematic diagram of a first embodiment of a data output buffer circuit in accordance with the present invention.

FIG. 2 is a schematic diagram of an embodiment of a data output buffer circuit in accordance with the present invention. The circuit of FIG. 2 includes a logic circuit which includes a pair of inverters 21 and 22 and a data latch circuit 23. The first inverter 21 has an input terminal which receives a first data signal DOUPB and a power supply terminal which is connected to a first power supply VDD. The second inverter 22 includes an input terminal which receives a complimentary data signal DODPB and a power supply terminal which is connected to the first power supply VDD. The data latch circuit 23 is connected between the input terminals of inverters 21 and 22.

An NMOS pull-up transistor 26 has a channel connected between a second power supply VDQ and a data output terminal N2, while an NMOS pull-down transistor has a channel connected between the data output terminal N2 and a ground terminal. The gate of transistor 26 is connected to the output terminal of inverter 21, and the gate of transistor 27 is connected to the output terminal of inverter 22. A first NMOS discharge transistor 24 has a channel connected between the gate of transistor 26 and the ground terminal. A second NMOS discharge transistor 25 has a channel connected between the gate of transistor 27 and ground. The gate of transistor 24 is connected to the output of inverter 22, while the gate of transistor 25 is connected to the output terminal of inverter 21.

In operation, in the event that the second power supply VDQ is energized before the first power supply VDD, the gates of transistors 26 and 27 are floating, and for example, if one of the gates of either transistors 26 and 27 is at a high logic level, then one of the discharge transistors 24 and 25 is necessarily turned on, which discharges the gate of either transistor 26 or 27. Accordingly, at least one of transistors 26 and 27 are turned off, thus preventing the second power supply VDQ from being short circuited. Further, if both gates of transistors 26 and 27 are floating at a high logic level, then both of transistors 26 and 27 will be turned off by the discharge transistors.

It should be noted that different components can be substituted for the various components in the circuit of FIG. 2 without affecting the operation of the circuit. For example, NMOS transistor 26 may be replaced by a bi-polar transistor while still performing the same function.

Figure 3:
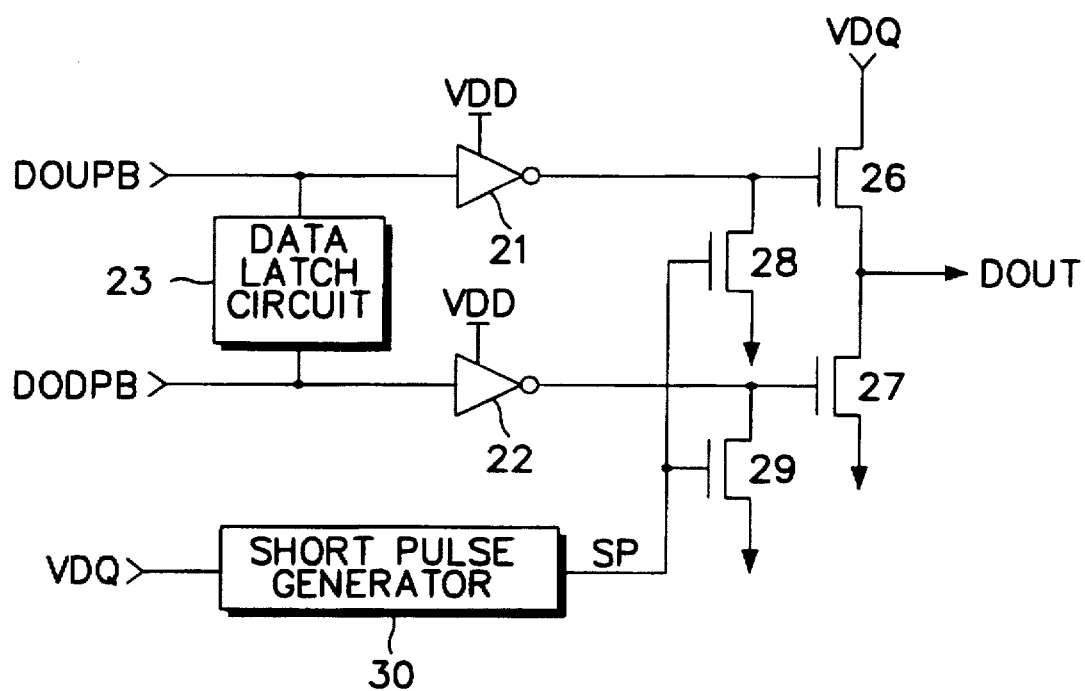
FIG. 3 is a schematic diagram of an alternative embodiment of a data output buffer circuit in accordance with the present invention.

FIG. 3 is a schematic diagram of an alternative embodiment of a data output buffer circuit in accordance with the present invention. The circuit of FIG. 3 is similar to that of FIG. 2, however, the first discharge transistor 24 of the circuit of FIG. 2 is removed and replaced with a first discharge transistor 28 in the circuit of FIG. 3 which has a channel connected between the gate of pull-up transistor 26 and the ground terminal. The second discharge transistor 25 of FIG. 2 is removed and replaced with a second discharge 29 which has a channel connected between the gate of pull-down transistor 27 and the ground terminal. The gates of transistors 28 and 29 are connected together and to an output terminal of a pulse generator 30. Pulse generator 30 is connected to the second power supply VDQ and generates a short pulse signal SP in response to variations in the voltage level of the second power supply VDQ.

In operation, if the gates of push-pull transistors 26 and 27 are floating in a charged state due to the sequence in which the first and second power supplies VDD and VDQ are energized, the pulse generator 30 will generator a pulse signal SP which turns on discharge transistors 28 and 29 , thereby discharging the gates of transistors 26 and 27 and preventing the second power supply VDQ from being short circuited.

Figure 4:
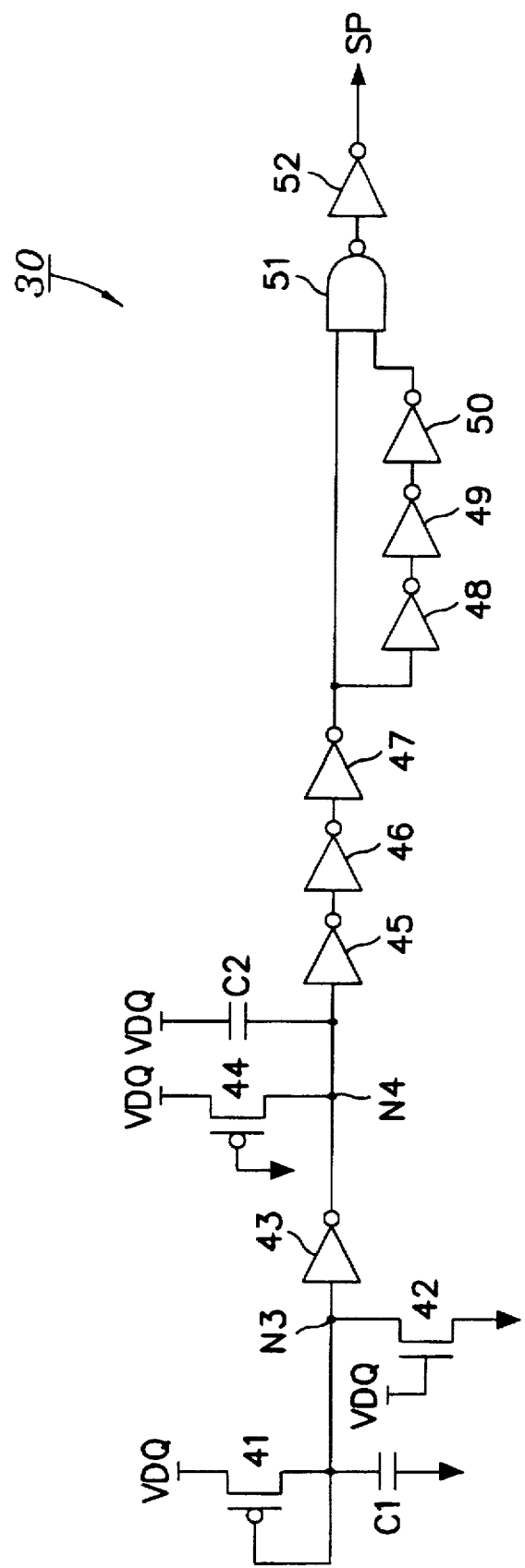
FIG. 4 is a schematic diagram of an embodiment of the pulse generator of FIG. 3 in accordance with the present invention.

Referring to FIG. 4, an embodiment of the short pulse generator 30 in accordance with the present invention includes a first delay circuit comprising three inverters 45, 46 and 47 connected in series, and a second delay circuit comprising three inverters 48, 49 and 50 connected in series. The input terminal of inverter 45 forms the input terminal of the first delay circuit and is capacitively coupled to the second power supply VDQ through capacitor C 2 which has one terminal connected to the second power supply VDQ and another terminal connected to the input terminal of inverter 45. The output terminal of inverter 47 forms the output terminal of the first delay circuit and is connected to the input terminal of inverter 48 which forms the input terminal of the second delay circuit. The output terminal of inverter 50 forms the output terminal of the second delay circuit and is connected to one input terminal of a two input NAND gate. The output terminal of the first delay circuit is connected to the other input terminal of NAND gate 51. An inverter 52 has an input connected to the output terminal of NAND gate 51 and an output terminal which forms the output terminal of the pulse generator 30 for transmitting the pulse signal. Thus, NAND gate 51 and inverter 52 form an AND gate.

The pulse generator 30 also includes a PMOS transistor 44 which has its channel connected between the second power supply VDQ and the input terminal of the first delay circuit at node N4. The gate of transistor 44 is connected to the ground terminal. An inverter 43 has an output terminal connected to node N4 and an input terminal connected to a node N3. An NMOS transistor 42 has its channel connected between node N3 and the ground terminal, and a gate connected to the second power supply VDQ. A capacitor C1 is connected between node N3 and the ground terminal, and a PMOS transistor 41 has its channel connected between the second power supply VDQ and node N3. The gate of transistor 41 is connected back to node N3.

In operation, the output terminals of the first and second delay circuits switch from a high logic level to a low logic level in response to variations in the voltage of the second power supply VDQ which causes the output of NAND gate 51 to switch to a low logic level which is inverted to a high level signal by inverter 52. Thus, the pulse generator 30 generates a pulse signal SP which is applied to the gates of discharge transistors 28 and 29 in FIG. 3. The pulse width of the pulse signal SP may be adjusted by varying the number of inverters in each of the delay circuits.

Figure 5:
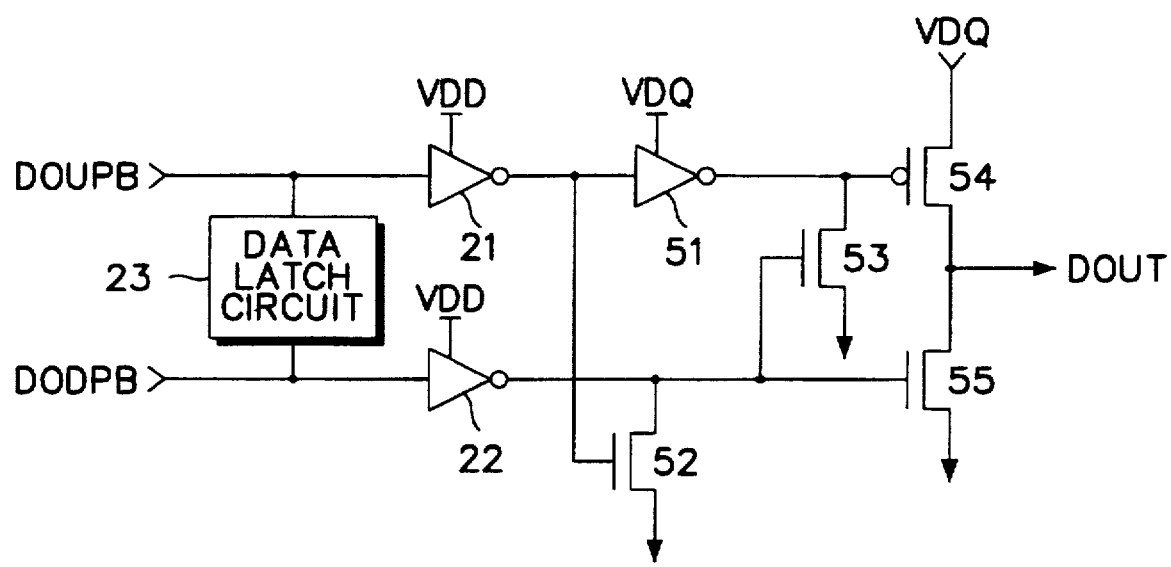
FIG. 5 is a schematic diagram of a second alternative embodiment of a data output buffer circuit in accordance with the present invention.

FIG. 5 is a schematic diagram of a second alternative embodiment of a data output buffer circuit in accordance with the present invention. The circuit of FIG. 5 includes a logic circuit comprising first and second inverters 21 and 22 and a data latch circuit 23, which are powered by a first power supply VDD, and are connected in the same manner as the logic circuit in the embodiment of FIG. 2. The embodiment shown in FIG. 5, however, includes a PMOS pull-up transistor 54 which has its channel connected between a second power supply VDQ and a node N2. An NMOS pull-down transistor 55 has its channel connected between node N2 and a ground terminal. An inverter 51 has an input terminal connected to the output terminal of inverter 21 and a power supply terminal connected to the second power supply VDQ. A first NMOS discharge transistor 53 has its channel connected between the output terminal of inverter 21 and the ground terminal, and a second NMOS discharge transistor 52 has its channel connected between the gate of transistor 55 and the ground terminal. The gate of transistor 53 is connected to the output terminal of inverter 22, while the gate of transistor 52 is connected to the output terminal of inverter 21.

In operation, if the second power supply VDQ is energized before the first power supply VDD, and the input terminal of inverter 51 is floating in a charged state, transistor 54 will be turned on because inverter 51 is powered by the second power supply VDQ. However, in this situation, the gate of transistor 52 will also be floating in a charged state, which will in turn, turn on transistor 52, thereby discharging the gate of pull-down transistor 55 and turning it off. This prevents malfunctions due to shorting the second power supply VDQ because either the PMOS transistor 54 or the NMOS transistor 55 will necessarily be in an off state.

Thus, the present invention provides a data output buffer circuit which is capable of interfacing circuitry that operates on two separate power supplies while preventing malfunctions due to the sequence in which the separate power supplies are energized.

Having described and illustrated the principals of the invention in a preferred embodiment thereof, it should be apparent that the invention can be modified in arrangement and detail without departing from such principals. We claim all modifications and variations coming within the spirit and scope of the following claims.

We claim:

1. A data output buffer circuit comprising:

a logic circuit having a first output terminal and a second output terminal, the logic circuit powered by a first power supply;

a pull-up transistor having a controlled current path coupled between a second power supply and a data output terminal and a control terminal coupled to the first output terminal of the logic circuit;

a pull-down transistor having a controlled current path coupled between a ground terminal and the data output terminal and a control terminal coupled to the second output terminal of the logic circuit;

a first discharge transistor having a control terminal and a controlled current path that is coupled between the first output terminal of the logic circuit the ground terminal;

a second discharge transistor having a control terminal and a controlled current path that is coupled between the control terminal of the pull-down transistor and the ground terminal; and a pulse generator coupled to the control terminals of the first and second discharge transistors.

2. A data output buffer circuit according to claim 1 wherein:

the control terminal of the first discharge transistor is coupled to the second output terminal of the logic circuit; and the control terminal of the second discharge transistor is coupled to the first output terminal of the logic circuit.

3. A data output buffer circuit according to claim 2 further including an inverter having an input terminal coupled to the first output terminal of the logic circuit, an output terminal coupled to the control terminal of the pull-up transistor, and a power supply terminal coupled to the second power supply.

4. A data output buffer circuit according to claim 1 wherein: the logic circuit includes:

a first inverter having an output terminal that forms the first output terminal of the logic circuit, an input terminal for receiving a data signal, and a power supply terminal coupled to the first power supply;

a second inverter having an output terminal that forms the second output terminal of the logic circuit, an input terminal for receiving a complimentary data signal, and a power supply terminal coupled to the first power supply; and a data latch circuit coupled between the input terminals of the first and second inverters.

5. A data output buffer circuit according to claim 1 wherein the first and second discharge transistors are NMOS transistors.

6. A data output buffer circuit according to claim 1 wherein the pull-up and pull-down transistors are NMOS transistors.

7. A data output buffer circuit according to claim 3 wherein the pull-up transistor is a PMOS transistor and the pull-down transistor is an NMOS transistor.

8. A data output buffer circuit according to claim 1 wherein the first power supply has an operating voltage that is greater than or equal to the operating voltage of the second power supply.

9. A data output buffer circuit comprising:
- a logic circuit having a first output terminal and a second output terminal, the logic circuit powered by a first power supply;
- a pull-up transistor having a controlled current path coupled between a second power supply and a data output terminal and a control terminal coupled to the first output terminal of the logic circuit;
- a pull-down transistor having a controlled current path coupled between a ground terminal and the data output terminal and a control terminal coupled to the second output terminal of the logic circuit;
- a pulse generator that generates a pulse signal responsive to variations in the voltage level of the second power supply; and
- a first discharge transistor having a control terminal coupled to the pulse generator to receive the pulse signal and a controlled current path that is coupled between one of the control terminals of the pull-up and pull-down transistors and the ground terminal.

10. A data output buffer circuit according to claim 9 further including a second discharge transistor having a control terminal coupled to the pulse generator to receive the pulse signal and a controlled current path coupled between the other control terminal of the pull-up and pull-down transistors and the ground terminal.

11. A data output buffer circuit according to claim 9 wherein the pulse generator includes:
- an AND gate having a first input terminal, a second input terminal, and an output terminal for transmitting the pulse signal;
- a capacitor having a first terminal coupled to the second power supply and a second terminal;
- a first delay circuit having an input terminal coupled to the second terminal of the capacitor and an output terminal coupled to the first input terminal of the AND gate; and
- a second delay circuit having an input terminal coupled to the output terminal of the first delay circuit and an output terminal coupled to the second input terminal of the AND gate.

12. A data output buffer circuit according to claim 11 wherein the AND gate includes a NAND gate coupled in series with an inverter.

13. A data output buffer circuit according to claim 11 wherein each of the first and second delay circuits includes at least one inverter coupled in series.

14. A data output buffer circuit according to claim 11 wherein the pulse generator further includes:
- a second capacitor having a first terminal coupled to the ground terminal and a second terminal; and
- an inverter having an input terminal coupled to the second terminal of the second capacitor and an output terminal coupled to the input terminal of the first delay circuit.

15. A data output buffer circuit according to claim 14 wherein the pulse generator further includes:
- a first transistor having a controlled current path coupled between the second power supply and the input terminal of the first delay circuit and a control terminal coupled to the ground terminal;
- a second transistor having a controlled current path coupled between the second power supply and the input terminal of the inverter and a control terminal coupled to the input terminal of the inverter; and
- a third transistor having a controlled current path coupled between the ground terminal and the input terminal of the inverter and a control terminal coupled to the second power supply.

16. A data output buffer circuit according to claim 9 wherein the logic circuit includes:
- a first inverter having an output terminal that forms the first output terminal of the logic circuit, an input terminal for receiving a data signal, and a power supply terminal coupled to the first power supply;
- a second inverter having an output terminal that forms the second output terminal of the logic circuit, an input terminal for receiving a complimentary data signal, and a power supply terminal coupled to the first power supply; and
- a data latch circuit coupled between the input terminals of the first and second inverters.

17. A method for controlling a data output buffer circuit, the circuit including:
- a logic circuit having a first output terminal and a second output terminal, the logic circuit powered by a first power supply;
- a pull-up transistor having a controlled current path coupled between a second power supply and a data output terminal and a control terminal coupled to the first output terminal of the logic circuit;
- a pull-down transistor having a controlled current path coupled between a ground terminal and the data output terminal and a control terminal coupled to the second output terminal of the logic circuit; and
- at least one discharge transistor having a control terminal and a controlled current path coupled between one of the output terminals of the logic circuit and the ground terminal; the method comprising:
  energizing the second power supply;
  energizing the first power supply; and
  driving the control terminal of said at least one discharge transistor so as to turn on the at least one discharge transistor, thereby turning off one of the pull-up and pull-down transistors wherein driving the control terminal includes generating a pulse signal responsive to energizing the second power supply.

18. A method according to claim 17 wherein the at least one discharge transistor includes:
- a first discharge transistor having a control terminal and a controlled current path coupled between the first output terminal of the logic circuit and the ground terminal; and
- a second discharge transistor having a control terminal and a controlled current path coupled between the second output terminal of the logic circuit and the ground terminal; and
- wherein generating the control signal includes:
  coupling the control terminal of the first discharge transistor to the second output terminal of the logic circuit; and
  coupling the control terminal of the second discharge transistor to the first output terminal of the logic circuit.

* * * * *